US012690169B2

(12) United States Patent
Kitamura et al.

(10) Patent No.: US 12,690,169 B2
(45) Date of Patent: Jul. 21, 2026

(54) HEAT RADIATION STRUCTURE, ELECTRONIC APPARATUS, AND METHOD FOR MANUFACTURING SAME

(71) Applicant: LENOVO (SINGAPORE) PTE. LTD., Singapore (SG)

(72) Inventors: Masahiro Kitamura, Yokohama (JP); Junki Hashiba, Yokohama (JP); Takuroh Kamimura, Yokohama (JP); Ryota Watanabe, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 271 days.

(21) Appl. No.: 18/615,207

(22) Filed: Mar. 25, 2024

(65) Prior Publication Data

US 2025/0008696 A1    Jan. 2, 2025

(30) Foreign Application Priority Data

Jun. 28, 2023    (JP) ................................. 2023-106136

(51) Int. Cl.
   *H05K 7/20*       (2006.01)
   *G06F 1/20*       (2006.01)
(52) U.S. Cl.
   CPC ......... *H05K 7/20472* (2013.01); *G06F 1/203* (2013.01)
(58) Field of Classification Search
   None
   See application file for complete search history.

(56) References Cited

U.S. PATENT DOCUMENTS

| | | | | |
|---|---|---|---|---|
| 10,485,091 | B2 * | 11/2019 | Molla .................. | H05K 1/0203 |
| 11,895,810 | B2 * | 2/2024 | Manninen ............. | H05K 7/209 |
| 2006/0033205 | A1 * | 2/2006 | Sauciuc ................ | H10W 40/70 |
| | | | | 257/E23.098 |
| 2006/0137856 | A1 * | 6/2006 | Popovich ................ | F28F 1/405 |
| | | | | 165/80.4 |
| 2007/0074853 | A1 * | 4/2007 | Popovich ................ | F28F 1/405 |
| | | | | 165/80.4 |
| 2011/0036538 | A1 * | 2/2011 | Brunschwiler ........... | G06F 1/20 |
| | | | | 165/104.31 |
| 2014/0374080 | A1 * | 12/2014 | Hill ....................... | F28F 13/003 |
| | | | | 165/185 |
| 2020/0187392 | A1 * | 6/2020 | Joshi ..................... | F28D 20/023 |
| 2024/0038622 | A1 * | 2/2024 | Watanabe ........... | H10W 40/257 |

FOREIGN PATENT DOCUMENTS

| | | | | |
|---|---|---|---|---|
| JP | 2004146819 | A | 5/2004 | |
| JP | 7282929 | B1 | 5/2023 | |
| JP | 7285993 | B1 * | 6/2023 | .......... H10W 40/255 |
| KR | 101913770 | B1 | 11/2018 | |
| WO | 2012029560 | A1 | 3/2012 | |
| WO | 2013157535 | A1 | 10/2013 | |

* cited by examiner

*Primary Examiner* — Courtney L Smith
(74) *Attorney, Agent, or Firm* — SHIMOKAJI IP

(57)                ABSTRACT
A heat radiation structure includes a metal mesh brought into contact with the surface of a die, and a heat receiving plate configured to sandwich the mesh between the surface of the die and the heat receiving plate. The mesh is impregnated with a liquid metal at least at a portion brought into contact with the surface of the die and has a shape in which intersection points of vertical and horizontal element wires are crushed in a thickness direction of the mesh. The mesh has a flat portion formed on the surface side of the element wire at each intersection point.

7 Claims, 11 Drawing Sheets

HEAT RADIATION STRUCTURE, ELECTRONIC APPARATUS, AND METHOD FOR MANUFACTURING SAME

BACKGROUND OF THE INVENTION

Field of the Invention

The present invention relates to a heat radiation structure for an electrical component which generates heat, an electronic apparatus having the heat radiation structure, and a method for manufacturing the same.

Description of the Related Art

Portable information devices such as a laptop PC are provided with semiconductor chips such as a CPU and a GPU. The CPU and the GPU each have a shape which includes a substrate which is a part to be mounted on a board, and a rectangular die provided on the surface of the substrate.

The semiconductor chips such as the CPU, the GPU are heat generating elements, and it is necessary to radiate heat depending on their power consumption (particularly at a high load). As a means for radiating heat from the CPU and GPU, a heat radiator such as a vapor chamber, a heat spreader, or a heat sink may be used, and the heat may be diffused by bringing the heat radiator into contact with the surface of the die through such a heat radiator. A fluid such as a liquid metal or heat conductive grease may be interposed between the die and the heat radiator in order to efficiently transfer heat (for example, Japanese Unexamined Patent Application Publication No. 2004-146819).

SUMMARY OF THE INVENTION

The liquid metal is higher in thermal conductivity than the heat conductive grease and can effectively transfer heat from the die to the heat radiator. On the other hand, the liquid metal is characterized by being higher in fluidity than the heat conductive grease. When an electronic apparatus is moved while being carried around, it is susceptible to vibrations and shocks. Then, there is a concern that the liquid metal having fluidity may leak from a gap between the die and the heat radiator due to repeated forces received from the die and the heat radiator.

The liquid metal may have gallium as its main component and can cause chemical reactions with copper and solder. Further, since the liquid metal is conductive, a short circuit occurs when it leaks and gets in contact with peripheral electrical elements such as a capacitor, etc. Countermeasures of some kind are therefore required.

Therefore, the inventors of the present application are considering providing and sandwiching a metal mesh impregnated with a liquid metal between a heat generating element such as a semiconductor chip and a heat radiator such as a vapor chamber. The liquid metal impregnated into the metal mesh is maintained with almost no leakage.

By the way, since the metal mesh has element wires woven vertically and horizontally, the intersection points of the element wires form small protrusions, and there is a concern that the metal mesh may slightly damage the surface of the die which comes into contact therewith.

The present invention has been made in view of the above problems. An object of the present invention is to provide a heat radiation structure, an electronic apparatus, and a manufacturing method thereof capable of preventing deterioration in heat transfer performance between a heat generating electrical component and a heat radiator, and further maintaining the surface of the electrical component in a suitable state.

In order to solve the above problems and achieve the object, there is provided a heat radiation structure according to a first aspect of the present invention which is a heat radiation structure for an electrical component which generates heat, and includes a metal mesh brought into contact with a surface of the electrical component, and a heat radiator configured to sandwich the metal mesh between the surface of the electrical component and the heat radiator. The metal mesh is impregnated with a heat transfer fluid at least at a portion brought into contact with the surface of the electrical component t and has a shape in which intersection points of vertical and horizontal element wires are crushed in a thickness direction of the metal mesh.

An electronic apparatus according to a second aspect of the present invention is an electronic apparatus including an electrical component which generates heat, and includes a metal mesh brought into contact with a surface of the electrical component, and a heat radiator configured to sandwich the metal mesh between the surface of the electrical component and the heat radiator. The metal mesh is impregnated with a heat transfer fluid at least at a portion brought into contact with the surface of the electrical component and has a shape in which intersection points of vertical and horizontal element wires are crushed in a thickness direction of the metal mesh.

A method for manufacturing an electronic apparatus according to a third aspect of the present invention is a method for manufacturing an electronic apparatus having an electrical component which generates heat, and includes the steps of pressing a metal mesh, impregnating the metal mesh with a heat transfer fluid, and sandwiching the metal mesh between a surface of the electrical component and a heat radiator.

According to the above aspects of present invention, it is possible to prevent deterioration in heat transfer performance between a heat generating electrical component and a heat radiator maintain the surface of the electrical component in a suitable state since the intersection points of element wires are crushed in shape in a thickness direction.

DETAILED DESCRIPTION OF THE INVENTION

Embodiments of a radiation structure, an electronic apparatus, and a manufacturing method thereof according to the present invention will hereinafter be described in detail with reference to the accompanying drawings. Note that the present invention is not limited by the embodiments.

Figure 1:
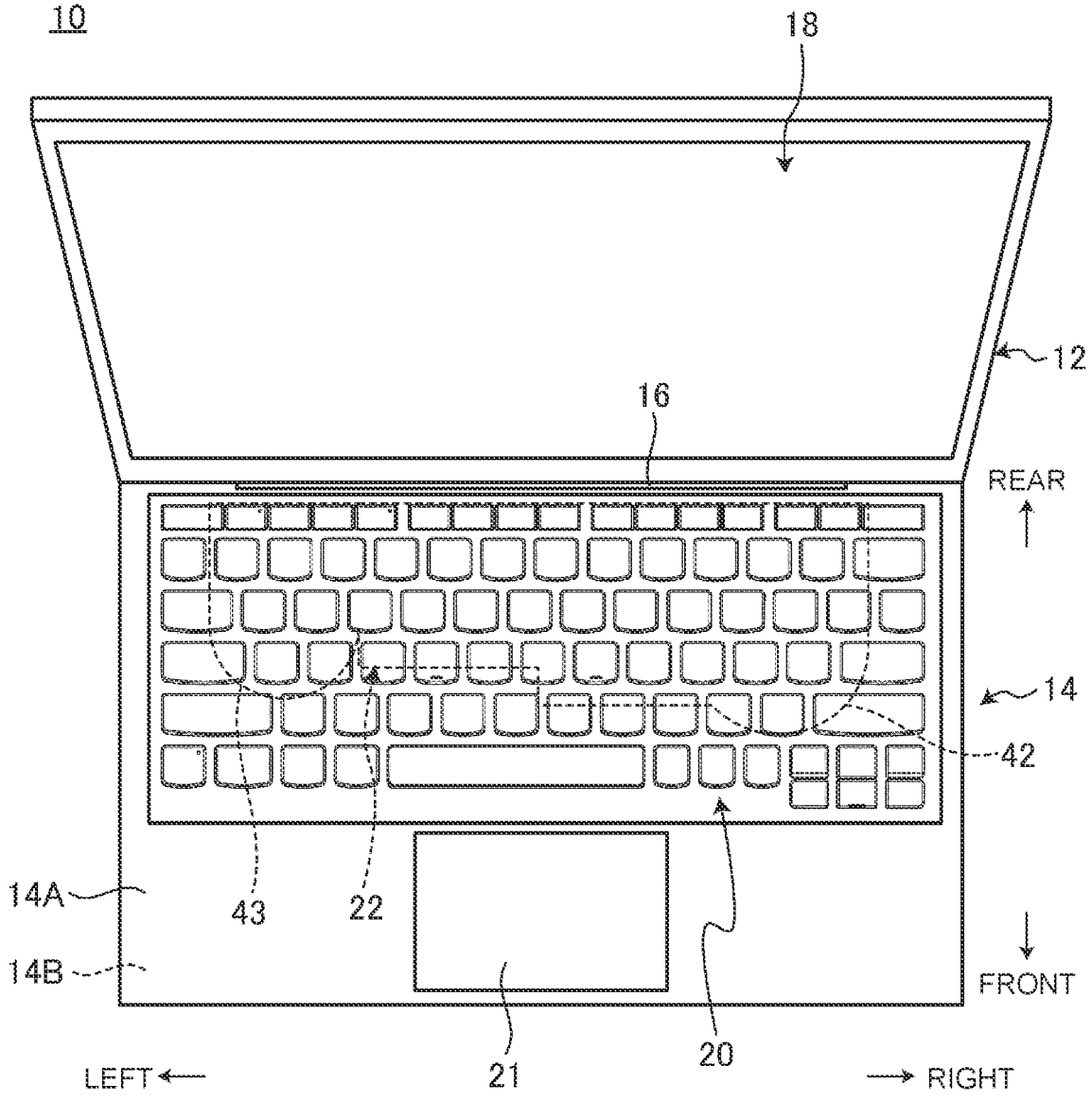
FIG. 1 is a schematic plan view of an electronic apparatus according to one embodiment as viewed from above.

FIG. 1 is a schematic plan view looked down from above an electronic apparatus 10 according to an embodiment. As illustrated in FIG. 1, the electronic apparatus 10 is a clamshell laptop PC in which a display chassis 12 and a chassis 14 are connected to each other so as to be relatively rotatable by a hinge 16, which is a so-called mobile workstation. The electronic apparatus according to the present invention may be, for example, a desktop PC, a tablet PC, a mobile phone, a smartphone, or a game machine, or the like in addition to the laptop PC.

The display chassis 12 is a thin flat box body. A display 18 is mounted on the display chassis 12. The display 18 is comprised of, for example, an organic EL (OLED: Organic Light Emitting Diode) or a liquid crystal.

Hereinafter, the chassis 14 and each element mounted thereon will be described by holding the chassis 12 and 14 in an open state as illustrated in FIG. 1 and referring to the front side as the front, the rear side as the rear, the width direction as left and right, and the height direction (thickness direction of the chassis 14) as up and down on the basis of the posture in which the display 18 is viewed.

The chassis 14 is a thin flat box body. The chassis 14 is comprised of a cover member 14A which forms an upper surface and four circumferential side surfaces, and a cover member 14B which forms a lower surface. The upper cover member 14A has a substantially bathtub shape whose lower surface is opened. The lower cover member 14B has a substantially flat shape and serves as a lid which closes an opening at the lower surface of the cover member 14A. The cover members 14A and 14B are overlapped in their thickness direction and detachably connected to each other. A keyboard 20 and a touch pad 21 are provided on the upper surface of the chassis 14. The chassis 14 has a rear end connected to the display chassis 12 using the hinge 16.

Figure 2:
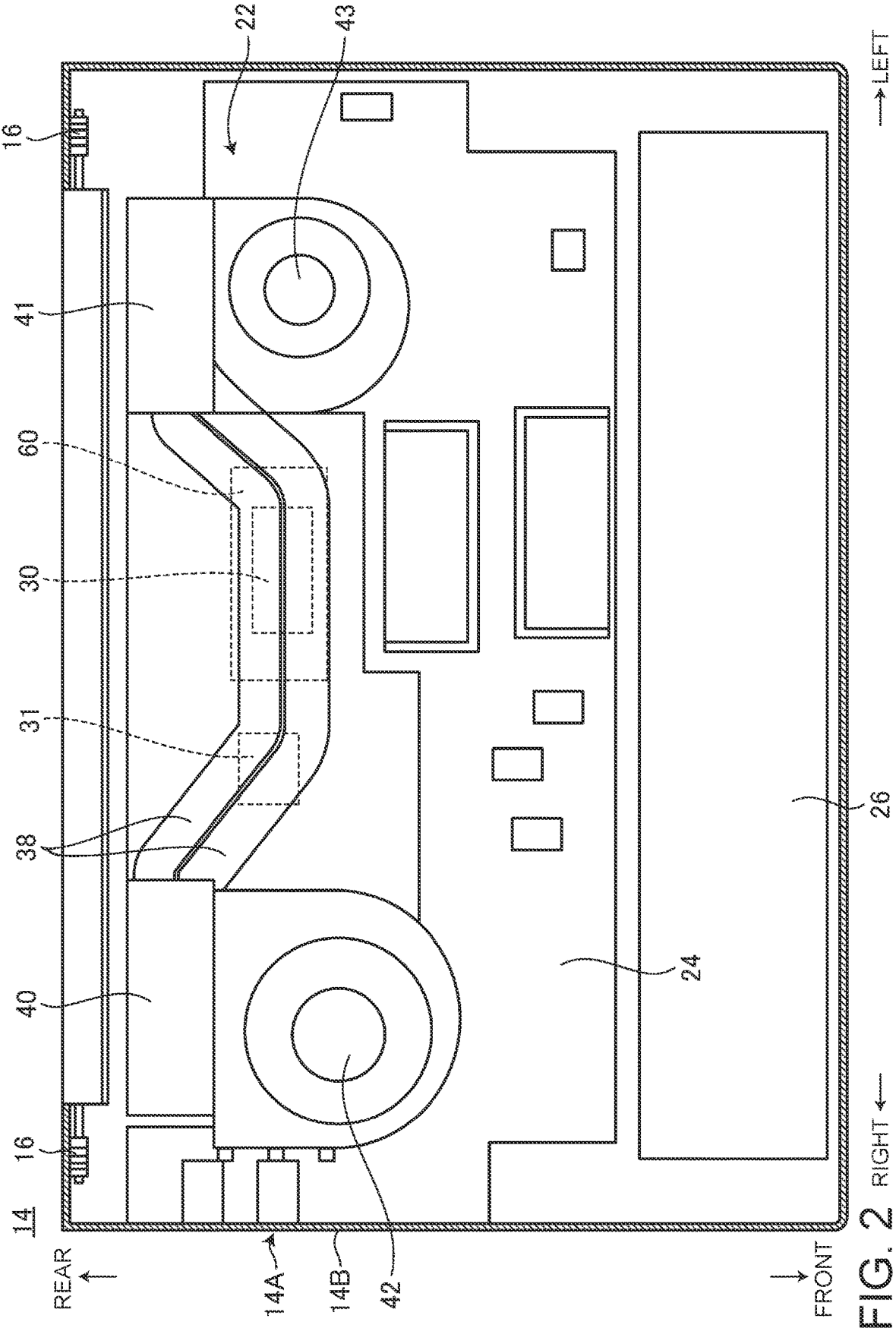
FIG. 2 is a bottom view schematically illustrating an internal structure of a chassis.

FIG. 2 is a bottom view schematically illustrating an internal structure of the chassis 14. In FIG. 2, the cover member 14B forming the lower surface is omitted to expose the inside. As illustrated in FIG. 2, the chassis 14 is provided therein with a cooling module 22, a motherboard (substrate) 24, and a battery device 26. The chassis 14 is further provided therein with various electronic components, mechanical parts, and the like.

The motherboard 24 is a main board of the electronic apparatus 10. The motherboard 24 is arranged close to the rear of the chassis 14 and extends along the left/right direction. The motherboard 24 is a printed circuit board on which various electronic components such as a communication module, a memory, and connection terminals are mounted in addition to a CPU (Central Processing Unit) 30, a GPU (Graphics Processing Unit) 31. The motherboard 24 is arranged under the keyboard 20 and screwed to a back surface of the keyboard 20 and an inner surface of the cover member 14A. The motherboard 24 has an upper surface which serves as a mounting surface for the cover member

14A, and a lower surface which serves as a mounting surface for the CPU 30 and the like. The CPU 30 performs calculations related to main control and processing of the electronic apparatus 10. The GPU 31 performs calculations necessary for image drawing such as 3D graphics. The CPU 30 and the GPU 31 are arranged side by side approximately in the center of the mounting surface of the motherboard 24.

The battery device 26 is a rechargeable battery which serves as a power source for the electronic apparatus 10. The battery device 26 is arranged in front of the motherboard 24 and extends left and right along a front end of the chassis 14.

The CPU 30 and the GPU 31 are heat generating elements each having the largest amount of heat generation among the electronic components mounted in the chassis 14. Therefore, the cooling module 22 absorbs and diffuses the heat generated by the CPU 30 and the GPU 31, and further discharges the heat to the outside of the chassis 14. The cooling module 22 is laminated on the lower surface of the motherboard 24.

The cooling module 22 includes a vapor chamber (heat radiator) 36, two heat pipes 38 and 38, a pair of left and right cooling fans 40 and 41, and a pair of left and right blower fans 42 and 43.

The vapor chamber 36 is a plate-shaped heat transport device. The vapor chamber 36 is of a type that forms a sealed space between two thin metal plates and fills the sealed space with a working fluid. The metal plate is formed of a metal with high thermal conductivity such as aluminum, copper, or stainless steel. The sealed space becomes a flow path through which the filled working fluid flows while undergoing a phase change. Examples of the working fluid can include water, alternative chlorofluorocarbon, acetone, or butane. A wick is arranged within the sealed space to feed the condensed working fluid by a capillary phenomenon. The wick is formed of a porous material such as a mesh made of thin metal wires knitted into a cotton-like shape, or a microchannel. The vapor chamber 36 is reinforced by a frame 45 (refer to FIG. 4).

The heat pipes 38 and 38 are each a pipe-shaped heat transport device. In the present embodiment, the two heat pipes 38 are used in parallel in a set of two back and forth, but one heat pipe or three or more heat pipes may be used. The heat pipe 38 is formed by crushing a metal pipe into a thin and flat shape to have an elliptical cross section. A working fluid is filled in a sealed space formed within the metal pipe. The metal pipe is formed of a metal with high thermal conductivity, such as aluminum, copper, or stainless steel. The sealed space becomes a flow path through which the filled working fluid flows while undergoing a phase change. Examples of the working fluid can include water, alternative chlorofluorocarbon, acetone, butane, or the like. A wick is arranged within the sealed space to feed the condensed working fluid by a capillary phenomenon. The wick is formed of a porous material such as a mesh made of thin metal wires knitted into a cotton-like shape, or a microchannel.

The cooling fins 40 and 41 on the left side each have a structure in which a plurality of plate-shaped fins are arranged at equal intervals in the left/right direction on the surface of a plate. Each fin stands up in the vertical direction and extends in the front/rear direction. A gap through which air sent from the blower fans 42 and 43 passes is formed between the adjacent fins.

Figure 3:
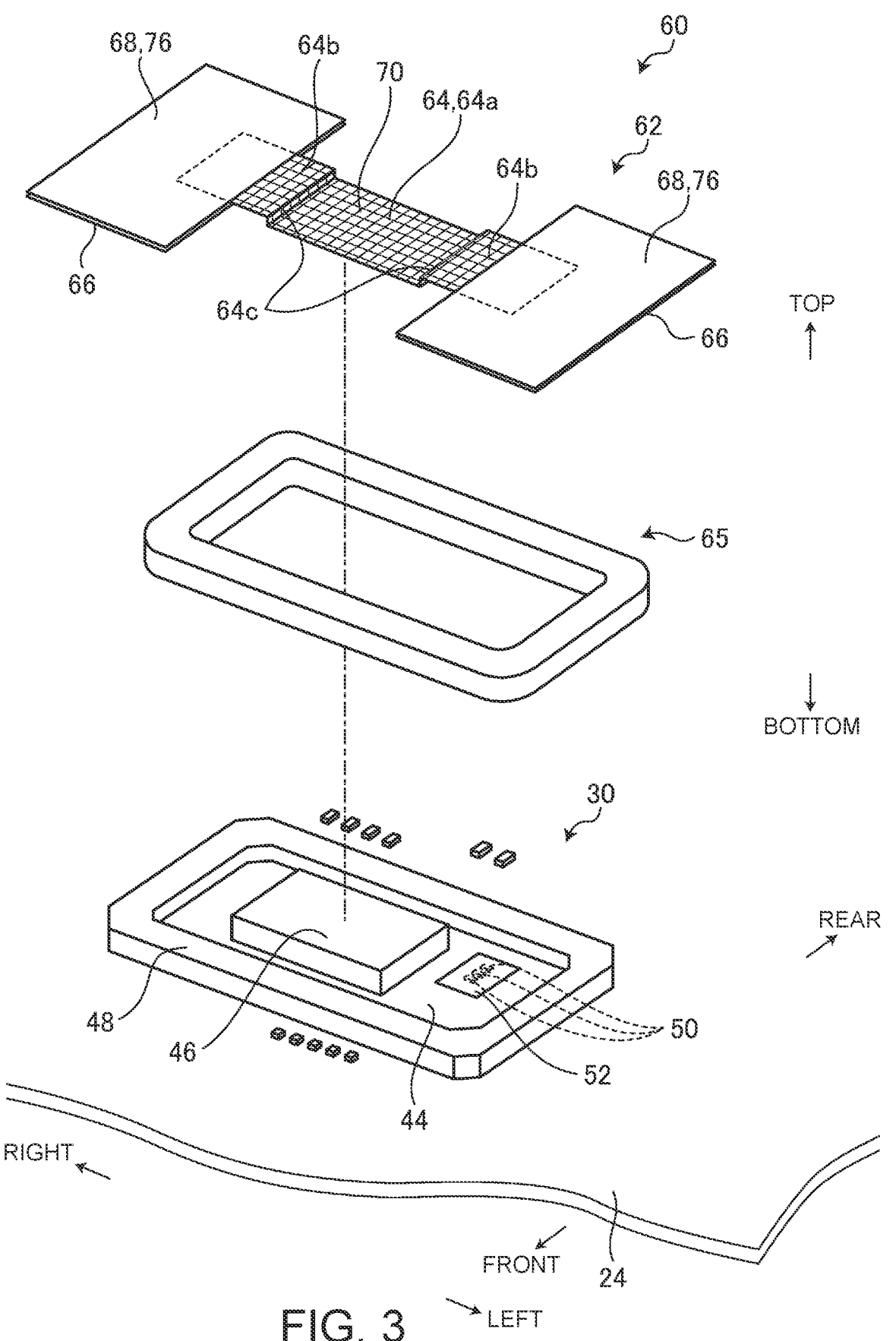
FIG. 3 is a schematic exploded perspective view of a CPU, a heat transfer structure, and a sponge mounted on a motherboard.

FIG. 3 is a schematic exploded perspective view of a CPU 30, a heat transfer structure 62, and a sponge 65 mounted on the motherboard 24.

The CPU 30 includes a substrate 44 and a die 46. The substrate 44 is a thin plate-shaped portion mounted on the motherboard 24 and has a rectangle shape long in the left/right direction in plan view. The die 46 is a potion including an arithmetic circuit, and is provided so as to slightly protrude from the surface of the substrate 44. The die 46 has a rectangular shape which is slightly long in the left/right direction when viewed in plane, and is provided substantially in the center of the surface of the substrate 44. The CPU 30 is one of the components which generates the most heat in the electronic apparatus 10, and even among them, the die 46 particularly generates heat.

A reinforcing rib 48 is erected on the four circumferential edges of the substrate 44. The rib 48 is slightly lower than the die 46. A gap between the die 46 and the rib 48 is slightly wide in the left/right direction, but narrow in the front/rear direction. Elements 50 such as a small capacitor are provided on the surface of the substrate 44. The elements 50 are covered with an insulating material 52. The insulating material 52 is, for example, an ultraviolet curable coating material and is formed into a film shape. The coating material is applied to cover the elements 50 and then cured by being irradiated with ultraviolet rays to form the insulating material 52. The ultraviolet curable coating material makes it easy to form the insulating material 52. The insulating material 52 may be another insulating adhesive or the like. A liquid metal 70 to be described later basically does not touch the elements 50, but when the elements 50 are covered with the insulating material 52, reliability thereof is further improved.

Figure 4:
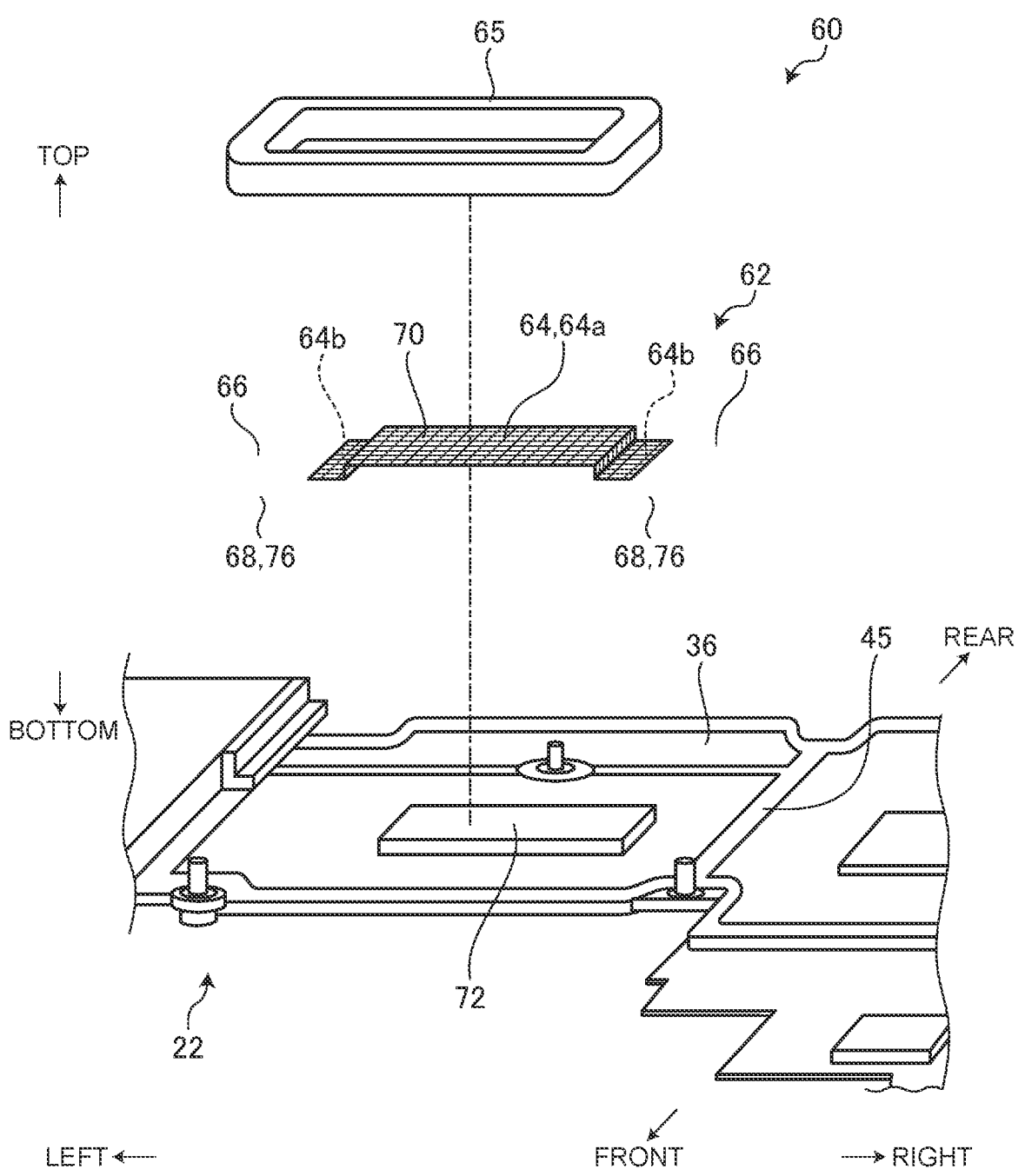
FIG. 4 is an exploded perspective view of a heat radiation structure.
Figure 5:
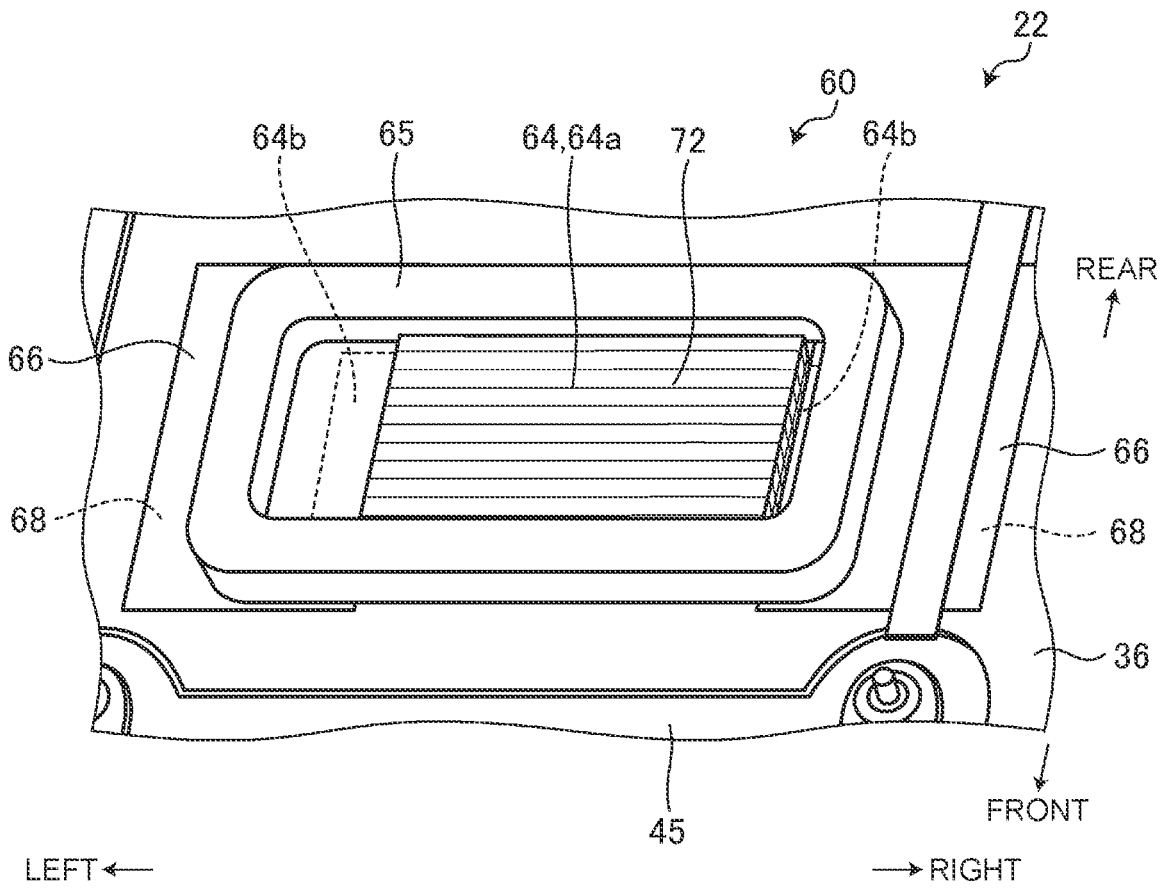
FIG. 5 is a perspective view of the heat radiation structure.
Figure 6:
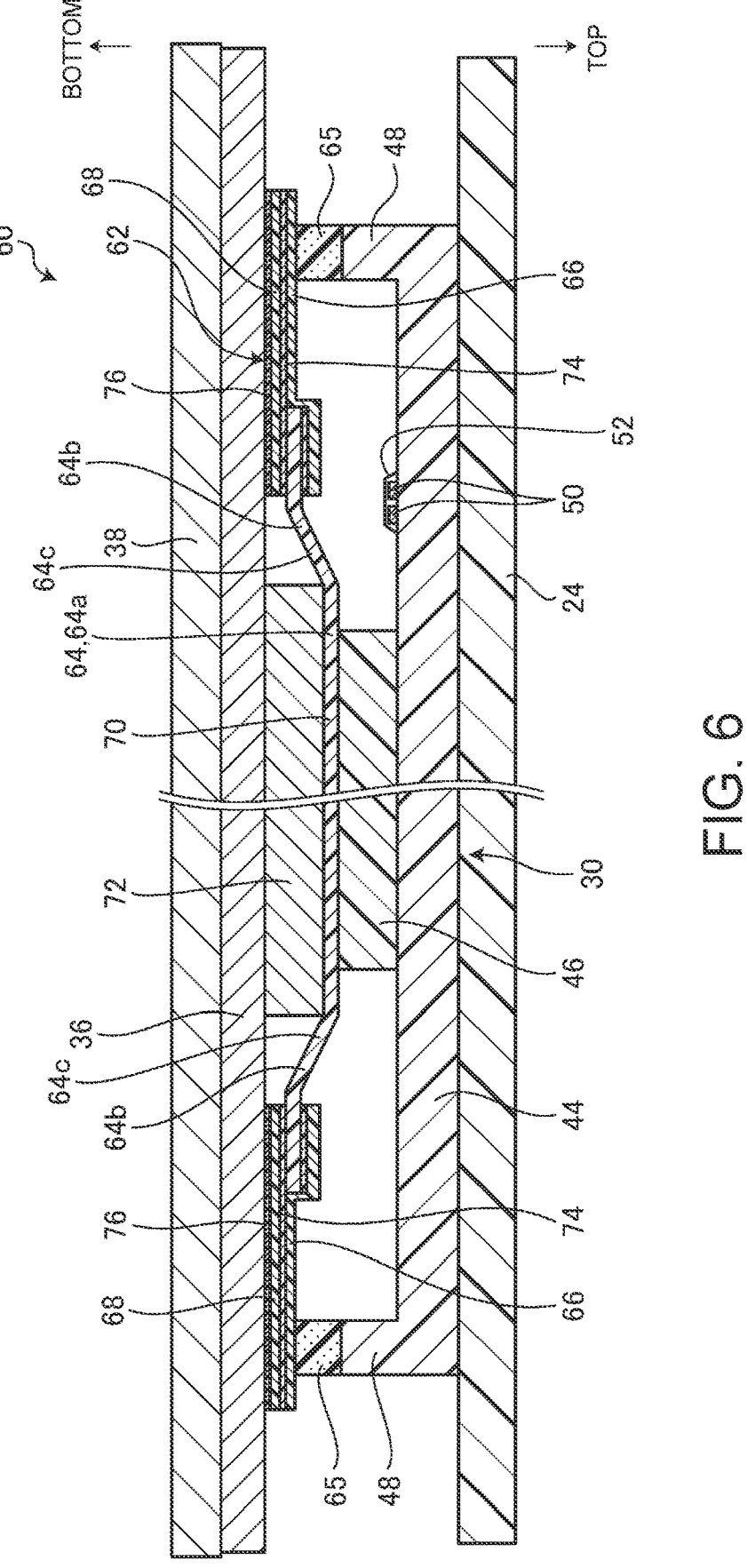
FIG. 6 is a schematic cross-sectional side view of the heat radiation structure.
Figure 7:
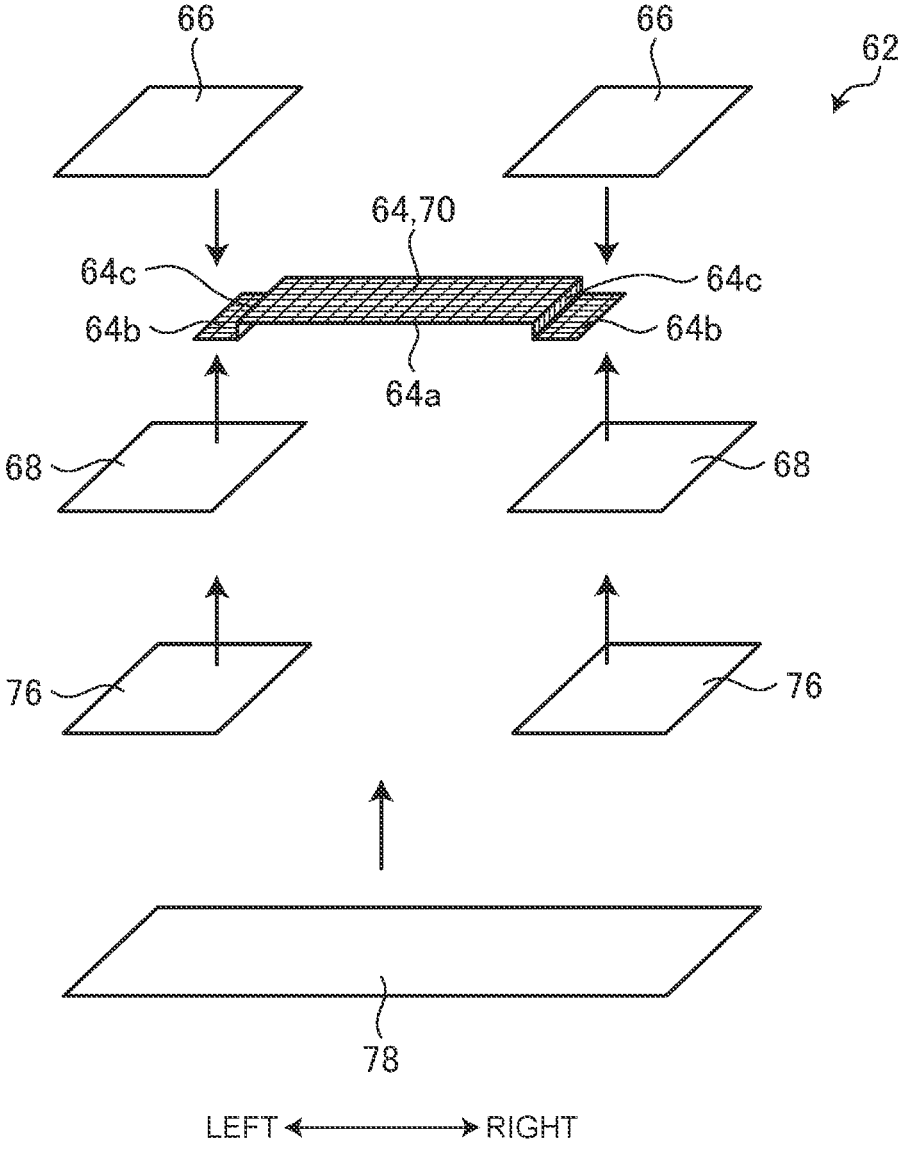
FIG. 7 is an exploded perspective view of the heat transfer structure.

Next, the heat radiation structure 60 according to the present embodiment will be described. FIG. 4 is an exploded perspective view of the heat radiation structure 60. FIG. 5 is a perspective view of the heat radiation structure 60. FIG. 6 is a schematic cross-sectional side view of the heat radiation structure 60. FIG. 7 is an exploded perspective view of the heat transfer structure 62.

The heat radiation structure 60 is for radiating heat particularly from the die (electrical component) 46 in the CPU (electrical component, semiconductor chip) 30 which generates heat, and has the heat transfer structure 62 and the sponge 65. Further, the vapor chamber 36 constitutes a part of the heat radiation structure 60.

The heat transfer structure 62 includes a mesh (metal mesh) 64 and sheet materials 66 and 68 sandwiching both ends of the mesh 64 in the left/right direction from above and below, respectively. The heat transfer structure 62 is small in size and light in weight. The mesh 64 and the sheet materials 66 and 68 are inexpensive.

The mesh 64 includes a central rectangular heating element contacting range part 64a and heating element non-contacting range parts 64b which continuously protrude in the left/right direction from the heating element contacting range part 64a. Specifically, the mesh 64 has a rectangular shape and has a central portion which corresponds to the heating element contacting range part 64a and other portions each corresponding to the heating element non-contacting range part 64b. A small step 64c corresponding to the thickness of a heat receiving plate 72 to be described later is formed at the boundary between the heating element contacting range part 64a and the heating element non-contacting range part 64b.

The heating element contacting range part 64a is a part which contacts the surface of the die 46 and receives heat. The mesh 64 is impregnated with a liquid metal (heat transfer fluid) 70 over almost the entire surface of at least the heating element contacting range part 64a. The heating element non-contacting range part 64b is basically not impregnated with the liquid metal 70. The amount of the liquid metal 70 used is suppressed to achieve cost reduction, and an adhesive material 74 to be described later is easier to be impregnated.

The liquid metal 70 is, for example, a metal whose main component is gallium and which is basically liquid at room temperature, but may be a phase change material or the like which becomes liquid at least at the temperature in its normal use when the motherboard 24 is energized and the CPU 30 is in operation. Since the liquid metal 70 is of the metal, it is excellent in thermal conductivity and electrical conductivity. Further, since the liquid metal 70 is liquid, it has fluidity.

The liquid metal 70 is basically impregnated over almost the entire surface of the heating element contacting range part 64a and is in contact with the surfaces of the die 46 and the vapor chamber 36 to thereby provide a good thermal connection between the two. Basically, the liquid metal 70 is impregnated over almost the entire surface of the heating element contacting range part 64a, but depending on the conditions, there may be provided a portion which is not impregnated, such as at the end of the heating element contacting range part 64a as room for absorbing an excess amount of the liquid metal. Since the liquid metal 70 is impregnated and held in the mesh 64, it will not leak out into the surroundings even if there is some degree of vibration or impact.

The means of impregnation may be taken by, for example, immersing the mesh 64 in a bath of the liquid metal 70 or applying the liquid metal 70 to the mesh 64. Although it may be difficult for the liquid metal 70 to be impregnated into the mesh 64, the mesh 64 is easy to handle as a single unit before it is incorporated into the heat radiation structure 60, and six sides of the top, bottom, front, back, left and right are open, so that the mesh 64 can be easily impregnated with the liquid metal 70. Further, since the mesh 64 is of the single unit at this time, it is possible to inspect the mesh 64 visually or by a predetermined means whether or not it is appropriately impregnated with the liquid metal 70.

The heating element contacting range part 64a has a rectangular shape which is the same as or slightly larger than the surface of the die 46, and covers the surface of the die 46. The heating element contacting range part 64a is provided with some small holes depending on a heat generation distribution or the like in the die 46, and the holes may be used as liquid pools of the liquid metal 70.

The heating element contacting range part 64a impregnated with the liquid metal 70 is thermally connected to the vapor chamber 36 via the heat receiving plate 72. The heat receiving plate 72 is, for example, a metal plate made of copper or the like, and can be regarded as a part of the vapor chamber 36 which substantially serves as a heat radiator. The heat receiving plate 72 may be omitted.

The heating element non-contacting range part 64b is formed continuously from the heating element contacting range part 64a in the left/right direction. The heating element non-contacting range part 64b does not contact the surface of the die 46.

Figure 8:
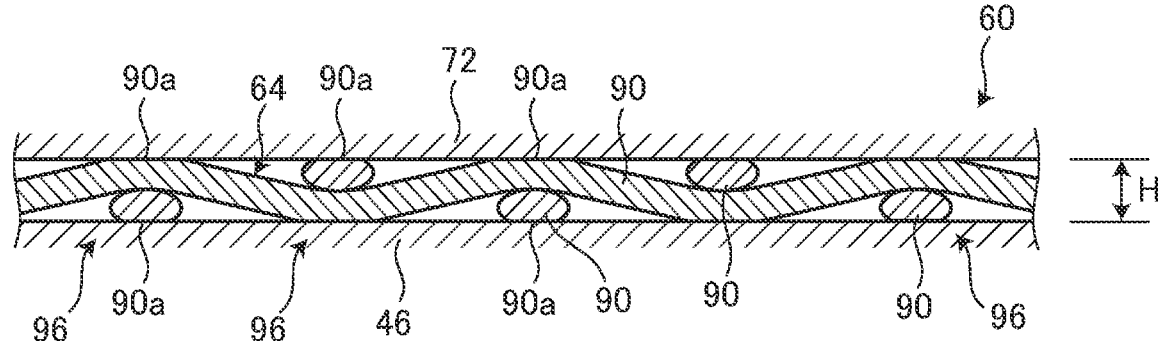
FIG. 8 is a cross-sectional view of a mesh and its peripheral portion.
Figure 9:
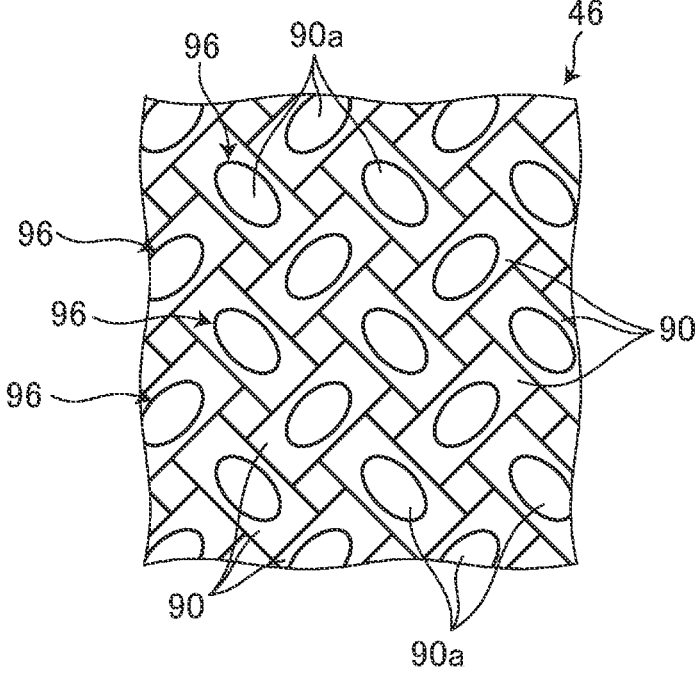
FIG. 9 is an enlarged plan view of the mesh.
Figure 10:
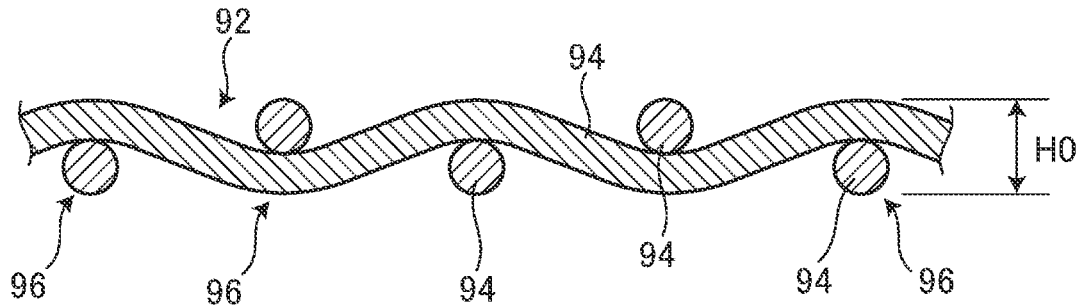
FIG. 10 is a cross-sectional view of a mesh material.
Figure 11:
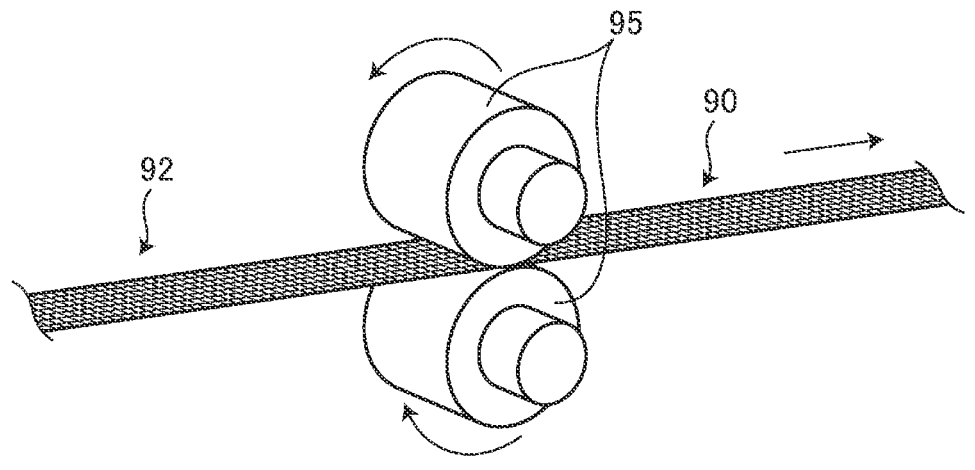
FIG. 11 is a schematic view illustrating the manner in which a mesh material is rolled to manufacture a mesh.

The mesh 64 will be further described. FIG. 8 is a cross-sectional view of the mesh 64 and its peripheral portion. FIG. 9 is an enlarged plan view of the mesh 64. In FIGS. 8 and 9, the liquid metal 70 is omitted. FIG. 10 is a cross-sectional view of a mesh material 92. FIG. 11 is a schematic view illustrating the manner in which the mesh material 92 is rolled to produce the mesh 64.

The mesh 64 is formed by weaving metal element wires 90 vertically and horizontally. The mesh 64 is made by rolling the mesh material 92 illustrated in FIG. 10 with a pair of rolling rollers 95 as illustrated in FIG. 11 to crush it in its thickness direction, and cutting it into a predetermined length. The thickness H0 of the mesh material 92 is twice the diameter of an element wire 94 whose cross section is substantially perfectly circular. On the other hand, the thickness H of the crushed mesh 64 is approximately 0.4 to 0.6 times the thickness H0. Specifically, the thickness H0 is about 0.1 mm, and the thickness H is about 0.04 to 0.06 mm. With such a thickness H, the element wire 90 becomes a moderately flat ellipse, and a flat portion 90a to be next described is reliably formed. Further, since a thickness of certain degree is maintained, it is easy to impregnate the liquid metal 70, and less liquid metal 70 is required compared to the mesh material 92.

The element wire 90 of the mesh 64 is obtained by crushing the element wire 94 of the mesh material 92. In particular, vertical and horizontal intersection points 96 are crushed, and the cross sections thereof each have a substantially elliptical shape which is thin in the thickness direction. Further, in the mesh 64, the flat portion 90a is formed on the element wire 90 at the intersection point 96. The flat portion 90a is formed on the surface side of the mesh 64 and the rear surface thereof, in other words, on the side where the element wire 90 contacts the die 46 or the heat receiving plate 72, and on the opposite side of the element wires 90 facing each other. The flat portion 90a is formed in direct contact with the rolling roller 95, and has a substantially elliptical shape in plan view (refer to FIG. 9). However, for reasons such as manufacturing precision, the flat portion 90a is not necessarily limited to a strict flat surface and may be slightly curved, or the flat portion 90a may be formed to be substantially flat to the extent that it can be distinguished from other surfaces as a trace of contact with the rolling roller 95.

Thus, the cross section of the element wire 90 which comes into contact with the die 46 and the heat receiving plate 72 is a flat, approximately elliptical shape along the surfaces of these to contact with each other, and has no local protrusion. Further, since the flat portion 90a is formed at the contacted intersection point 96, an appropriate contact area is ensured, so that pressure is dispersed and the surfaces of the die 46 and the heat receiving plate 72 can be maintained in a suitable state. In particular, the lid forming the surface of the die 46 is made of ceramics, an alloy, or the like, and may be scratched by protrusions, but the mesh 64 as described above can maintain the surface in a suitable state. Note that the mesh 64 can be easily formed by crushing (i.e., flattening) the entire surface of the mesh material 92 by rolling as illustrated in FIG. 11, but depending on the manufacturing conditions, and the like, the mesh may have a shape in which the intersection points 96 of the vertical and horizontal element wires 90 are crushed (i.e., flattened) in the thickness direction at least in the heating element contacting range part 64a.

The mesh 64 is made of a metal material and can obtain suitable heat transfer performance. When the mesh 64 is made of a metal material such as copper, an aluminum material or the like, it is preferable to use a material plated with a nickel material (including an alloy whose main component is nickel) or to apply a predetermined antiseptic treatment. In other words, at least the surface of the mesh 64 is made of a nickel material or is subjected to the antiseptic treatment, thereby making it possible to prevent the mesh 64 from being deteriorated by the liquid metal 70. By constituting the mesh 64 from the nickel material, plating treatment can be omitted. Further, suitable thermal conductivity can be obtained by nickel plating a copper material or an aluminum material.

Returning to FIGS. 4 to 7, the sheet materials 66 and 68 are made into a thin rein film shape, for example. The thickness of each of the sheet materials 66 and 68 is, for example, about 0.05 mm. The pair of heating element non-contacting range parts 64b are sandwiched by the pair of sheet materials 66 and 68, respectively. Although the sheet material 66 and the sheet material 68 are the same, here, the side to be attached to the vapor chamber 36 is assumed to be the sheet material 68, and the side opposite to the side is assumed to be the sheet material 66. The sheet materials 66 and 68 are overlapped on each other and partly sandwich three sides (vertical direction and right or left side) of the end of the heating element non-contacting range part 64b so as to surround the three sides. The sheet materials 66 and 68 each have a suitable area and can be securely fixed to the vapor chamber 36 with a sticky tape 76 to be described later. The heating element non-contacting range part 64b is basically not impregnated with the liquid metal 70. However, since the three sides are covered with the sheet materials 66 and 68 even if the liquid metal bleeds and spreads from the heating element contacting range part 64a and enters the heating element non-contacting range part 64b, it will not leak and spread any further.

The sheet materials 66 and 68 and the mesh 64, and the sheet materials 66 and 68 are fixed to each other by an adhesive material 74. The layer of the adhesive material 74 between the sheet materials 66 and 68 is sufficiently thin. The adhesive material 74 is appropriately impregnated into the heating element non-contacting range part 64b of the mesh 64 to obtain a high adhesive force. The heating element non-contacting range part 64b may be almost entirely covered with the sheet materials 66 and 68 depending on design conditions, or a portion close to the heating element contacting range part 64a may be exposed to some extent.

The sheet material 68 and the vapor chamber 36 are fixed with a sticky tape (sticky material) 76. The sticky tape 76 fixes the heat transfer structure 62 to the vapor chamber 36 with an appropriate sticking force, but can be removed as needed such as during maintenance. The thickness of the sticky tape 76 is, for example, about 0.05 mm. A part of the overlapped sheet materials 66 and 68 may be pasted onto the frame 45 (refer to FIG. 4) or may be inserted under the frame 45 depending on design conditions.

The sponge 65 has a frame shape and closes a gap between the vapor chamber 36 and the substrate 44 around the die 46. A part of the sponge 65 is in contact with the vapor chamber 36 through portions of the sheet materials 66 and 68 which do not overlap with the mesh 64. That is, the sponge 65 is provided so as to surround the periphery of the mesh 64 in plan view. Although the liquid metal 70 basically does not contact the electrical components mounted on the motherboard 24, the four circumferences of the substrate 44 are partitioned with the sponge 65 thereby to further prevent the liquid metal 70 from leaking to the surroundings. Further, the sponge 65 is provided between the rib 48 and the vapor chamber 36 and is fixed with a sticky material. Consequently, the thickness of the sponge 65 can be made thin and stabilized.

Figure 12:
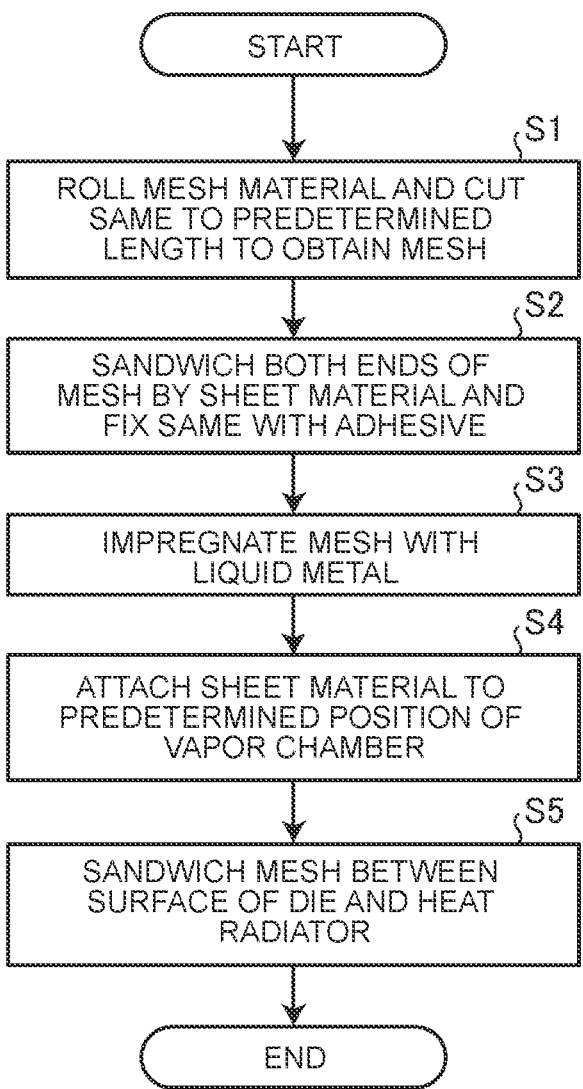
FIG. 12 is a flowchart illustrating a part of a manufacturing method of an electronic apparatus.

Next, a description will be made about a part of a method for manufacturing the electronic apparatus 10. FIG. 12 is a flowchart illustrating the part of the manufacturing method of the electronic apparatus 10.

In the process of assembling the heat radiation structure 60, a first manufacturer first rolls the mesh material 92 (refer to FIG. 11), and then cuts it to a predetermined length to obtain the mesh 64 (Step S1). However, crushing the mesh material 92 depending on manufacturing conditions is not limited to the rolling process, and another pressing means may be used. The above nickel plating or antiseptic treatment may be performed either before or after the rolling process. The mesh 64 is subjected to bending work so as to be divided into the heating element contacting range part 64a and the heating element non-contacting range part 64b (refer to FIG. 7).

Next, the first manufacturer assembles the heat transfer structure 62. Here, as illustrated in FIG. 7, the heating element non-contacting range parts 64b at both ends of the mesh 64 are sandwiched by the sheet materials 66 and 68 and fixed with the adhesive material 74 as described above (Step S2). The sticky tape 76 is attached to the opposite side of the sheet material 68 facing the sheet material 66. Further, a release paper 78 is attached to the opposite side of the sticky tape 76 facing the sheet material 68 to protect a sticking surface thereof. The thickness of the release paper 78 is, for example, about 0.1 mm. One release paper 78 may be provided across the two sheet materials 68, or two release papers 78 may be provided individually for the two sheet materials 68.

The first manufacturer further impregnates the heating element contacting range part 64a of the mesh 64 with the liquid metal 70 (Step S3). The timing to impregnate the liquid metal 70 is taken, for example, after the heating element non-contacting range part 64b is sandwiched by the sheet materials 66 and 68. The heat transfer structure 62 assembled by the first manufacturer is supplied to a second manufacturer. Such a heat transfer structure 62 can be handled as one component and is portable. When one release paper 78 is provided across the two sheet materials 68, the release paper 78 protects one surface of the heating element contacting range part 64a impregnated with the liquid metal 70 when the heat transfer structure 62 is transported alone. A protective film may be separately provided on the other surface of the heating element contacting range part 64a for during transportation.

Figure 13:
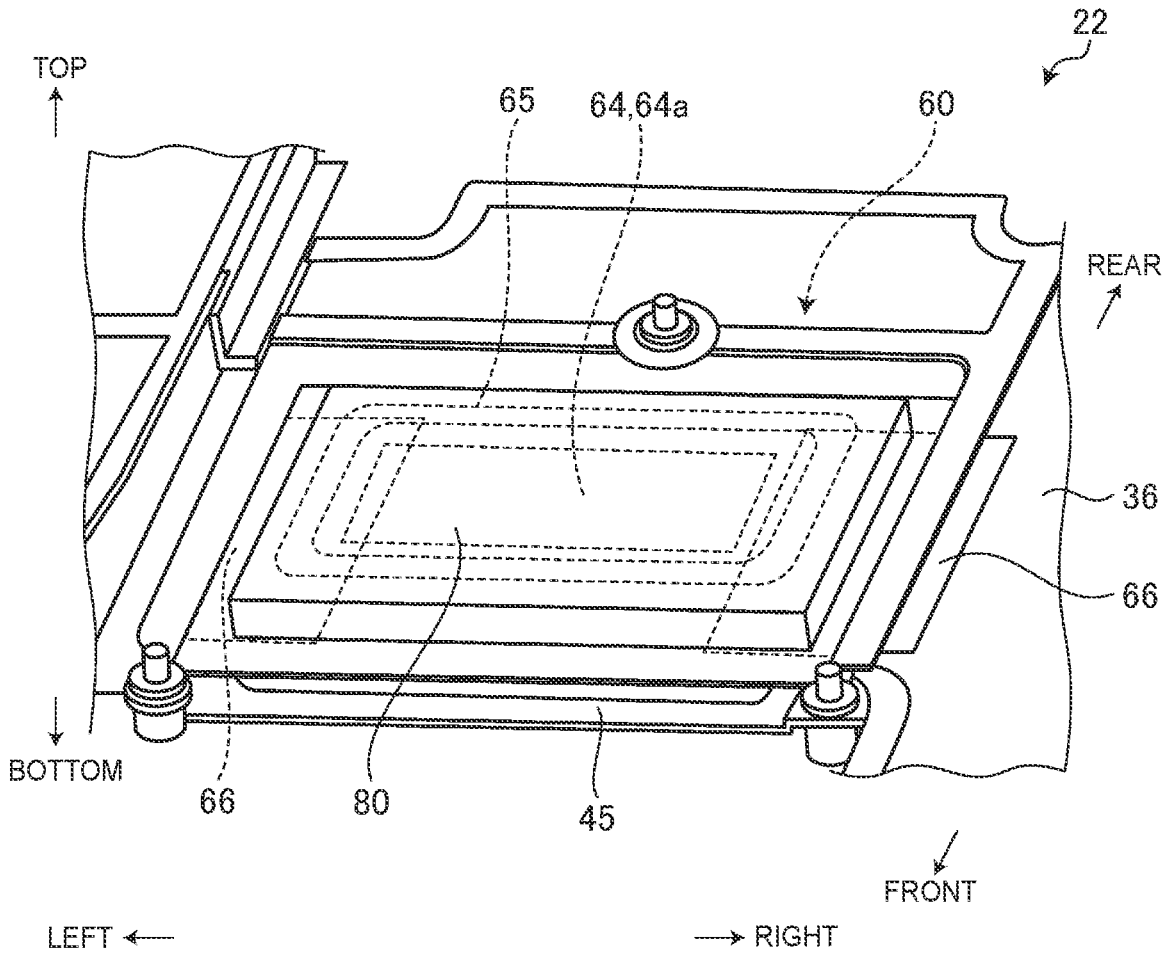
FIG. 13 is a perspective view of a heat radiation structure covered with a protective film.

The second manufacturer is an artisan who assembles the cooling module 22. The artisan peels off the release paper 78 from the supplied heat transfer structure 62, attaches the sheet material 68 to which the sticky tape 76 is attached to a predetermined position of the vapor chamber 36, and then attaches the sponge 65 as illustrated in FIG. 4 (Step S4). The heat radiation structure 60 (refer to FIG. 5) assembled by the second manufacturer in this way is covered with a protection film 80 as illustrated in FIG. 13. The cooling module 22 including the heat radiation structure 60 assembled by the second manufacturer is supplied to a third manufacturer. Thus, since the heat radiation structure 60 is incorporated into the cooling module 22, it can be handled integrally with the cooling module 22.

The third manufacturer is a manufacturer which assembles the electronic apparatus 10. The manufacturer peels off the protective film 80 from the supplied cooling module 22 and attaches it to a predetermined position within the chassis 14 as illustrated in FIG. 2. Consequently, the heating element contacting range part 64a of the mesh 64 in the heat transfer structure 62 is sandwiched between the surface of the die 46 and the vapor chamber 36 and comes into contact with the two (Step S5). Since the heating element contacting range part 64a is impregnated with the liquid metal 70, the thermal resistance between the die 46 and the vapor chamber 36 becomes sufficiently small.

Also, the third manufacturer can handle the cooling module 22 including the heat radiation structure 60 as one component, and can install it in the chassis 14 with a simple operation such as screwing. Further, since the third manufacturer basically does not need to handle the liquid metal 70, there is no need for a storage device and a coating device for the liquid metal 70. This is suitable for mass production assembly.

Furthermore, when it becomes necessary to replace the heat transfer structure 62 during repair and maintenance of the electronic apparatus 10, it is sufficient for a worker to reattach the heat transfer structure 62 for replacement, and there is no need to transport the electronic apparatus 10 to a facility which has a storage device and a coating device for the liquid metal 70. Therefore, there is no limitation to a work location for repair and a service base, etc.

Since the heat transfer structure 62 including the liquid metal 70 is integrally detached with the cooling module 22 or the vapor chamber 36 during repair, the heat transfer structure 62 does not remain alone on the CPU 30, and the liquid metal 70 is not scattered and is easy to handle.

In the heat radiation structure 60, the heat transfer structure 62, and the electronic apparatus 10 as described above, the liquid metal 70 is impregnated in the heating element contacting range part 64a of the mesh 64, so that its leakage to the surroundings is prevented. Further, the action of the liquid metal 70 can prevent the heat transfer performance between the die 46 and the vapor chamber 36 from deteriorating. Furthermore, the heating element contacting range part 64a is sandwiched by the die 46 and the heat receiving plate 72 and is stable to some extent, but the heating element non-contacting range parts 64b at both ends are fixed to the vapor chamber 36 through the sheet materials 66 and 68, respectively, whereby a positional displacement of the mesh 64 can be further prevented. The mesh 64 is somewhat hard and is not suitable for being directly fixed to the vapor chamber 36, but the mesh 64 can be suitably fixed to the vapor chamber 36 by securing a suitable area by the flexible sheet materials 66 and 68.

Since the pair of heating element non-contacting range parts 64b are sandwiched by the pair of sheet materials 66 and 68 respectively, they are strong and difficult to come off. In particular, when the heat transfer structure 62 is transported or installed as a single unit, they become difficult to come off. However, depending on design conditions, the sheet material 68 may be omitted and the heat transfer structure 62 may be fixed to the vapor chamber 36 using only the sheet material 66. Although the sheet materials 66 and 68 sandwich the three sides of the end of the heating element non-contacting range part 64b so as to surround the three sides, they may be made to surround only the left/right direction or the front/rear direction depending on the design conditions.

The heat transfer structure 62 can be applied to various dies 46 as long as the heating element contacting range part 64a has an appropriate area. Further, the vapor chamber 36 on the fixed side has high versatility since there are no particular restrictions. Since the mesh 64 constituting the heat transfer structure 62 has a rectangular shape comprised of the heating element contacting range part 64a and the heating element non-contacting range parts 64b on both sides thereof, it is suitably applicable to the horizontally-elongated shaped CPU 30 and die 46 in particular. In the CPU 30 of the above example, the vertical interval between the edge of the die 46 and the rib 48 is small, but the horizontal interval is relatively large. By arranging the rectangular-shaped mesh 64 along the left/right direction, the rib 48 is less likely to interfere with the sheet materials 66 and 68, and space is used effectively. The heat radiation structure 60 and the heat transfer structure 62 can also be applied to an electrical component (for example, the GPU 31) which generates heat, other than the CPU 30.

The material impregnated into the mesh 64 is not limited to the liquid metal 70, but may be other heat transfer fluids such as heat transfer grease. The heat transfer fluid in this application refers not only to liquid but also to those having fluidity such as semi-solids and viscous bodies, and includes grease, oil compounds, and the like.

It goes without saying that the present invention is not limited to the embodiments described above, and can be freely modified within the scope not departing from the spirit of the present invention.

The invention claimed is:

1. A heat radiation structure for an electrical component which generates heat, comprising:

a metal mesh in direct contact with a surface of the electrical component; and a heat radiator that sandwiches the metal mesh between the surface of the electrical component and the heat radiator, wherein the metal mesh is impregnated with a heat transfer fluid at least at a portion in contact with the surface of the electrical component and has a shape in which intersection points of vertical and horizontal element wires are flattened in a thickness direction of the metal mesh.

2. The heat radiation structure according to claim 1, wherein the metal mesh has a flat portion at which a flattened element wire interfaces either the electrical component or the heat radiator.

3. The heat radiation structure according to claim 1, wherein the metal mesh includes a heating element contacting range part which is impregnated with the heat transfer fluid in a central portion of the metal mesh and receives heat by directly contacting the surface of the electrical component, and a pair of heating element non-contacting range parts which extend continuously from both sides of the heating element contacting range part and are free of contact with the surface of the electrical component, and wherein the pair of heating element non-contacting range parts are fixed to the heat radiator through respective sheet materials.

4. The heat radiation structure according to claim 3, wherein the pair of heating element non-contacting range parts are sandwiched by the pair of respective sheet materials.

5. The heat radiation structure according to claim 1, including a board and a semiconductor chip mounted on the board, wherein the semiconductor chip includes a substrate and a die, and wherein the electrical component is the die.

6. An electronic apparatus having an electrical component which generates heat, comprising:

a metal mesh in direct contact with a surface of the electrical component; and a heat radiator that sandwiches the metal mesh between the surface of the electrical component and the heat radiator, wherein the metal mesh is impregnated with a heat transfer fluid at least at a portion in contact with the surface of the electrical component and has a shape in which intersection points of vertical and horizontal element wires are flattened in a thickness direction of the metal mesh.

7. A method for manufacturing an electronic apparatus having an electrical component which generates heat, comprising the steps of:

applying a pressing force on a metal mesh;

impregnating the metal mesh with a heat transfer fluid; and sandwiching the metal mesh between a surface of the electrical component and a heat radiator, whereby the metal mesh is in direct contact with the surface of the electrical component.

* * * * *